(12) United States Patent
Lee et al.

(10) Patent No.: US 6,410,901 B1
(45) Date of Patent: Jun. 25, 2002

(54) IMAGE SENSOR HAVING BLOOMING EFFECT PREVENTING CIRCUITRY

(75) Inventors: Jae-Dong Lee; Ju-Il Lee, both of Ichon-shi (KR)

(73) Assignee: Hyundai Electronics Industries Co., Ltd. (KR)

(*) Notice: Subject to any disclaimer, the term of this patent is extended or adjusted under 35 U.S.C. 154(b) by 83 days.

(21) Appl. No.: 09/693,185

(22) Filed: Oct. 19, 2000

(30) Foreign Application Priority Data

Oct. 22, 1999 (KR) .............................. 99-46055

(51) Int. Cl.⁷ .............................. H01L 27/00
(52) U.S. Cl. .................... 250/208.1; 257/230
(58) Field of Search ............ 250/208.1, 214.1; 348/294, 299; 257/223, 230

(56) References Cited

U.S. PATENT DOCUMENTS

| | | | | |
|---|---|---|---|---|
| 5,614,744 A | * | 3/1997 | Merrill | 257/291 |
| 6,002,123 A | * | 12/1999 | Suzuki | 250/208.1 |
| 6,157,016 A | * | 12/2000 | Clark et al. | 250/208.1 |
| 6,300,615 B1 | * | 10/2001 | Shinohara et al. | 250/214 R |
| 6,307,195 B1 | * | 10/2001 | Guidash | 250/208.1 |

\* cited by examiner

*Primary Examiner*—Stephone Allen
*Assistant Examiner*—Seung Sohn
(74) *Attorney, Agent, or Firm*—Townsend and Townsend and Crew, LLP

(57) ABSTRACT

An image sensor includes a plurality of unit pixels for sensing a light beam to generate an image data. Each unit pixel includes a light sensing element for sensing a light beam incident thereto and generating photoelectric charges, a transferring unit for transferring the photoelectric charges to a sensing node, a first resetting unit for making a fully depleted region within the light sensing element and resetting the sensing node by providing a power supply voltage to the sensing node, and a second resetting unit for transferring excess charges generated in the light sensing element to a power line when the sensing node is reset.

14 Claims, 5 Drawing Sheets

IMAGE SENSOR HAVING BLOOMING EFFECT PREVENTING CIRCUITRY

FIELD OF THE INVENTION

The present invention relates to an image processing element; and, more particularly, to an image sensor having a plurality of unit pixels for preventing a blooming effect.

DESCRIPTION OF THE PRIOR ART

As is well known, an image sensor is an apparatus for sensing a light reflected from an object to generate an image data. Especially, an image sensor fabricated by using a complementary metal oxide semiconductor (CMOS) technology is called a CMOS image sensor.

Generally, the CMOS image sensor includes a plurality of unit pixels. Each of the unit pixels also includes a light sensing element and a plurality of transistors. The light sensing element such as a photodiode senses incident light reflected from an object and accumulates photoelectric charges that are generated due to the incident light. The transistors control a transfer of the photoelectric charges.

FIG. 1A is a circuit diagram showing a conventional unit pixel contained in a CMOS image sensor. A reference numeral 160 represents a load transistor used for stabilizing an output signal of the unit pixel. FIG. 1B is a diagram showing a layout of a conventional unit pixel shown in FIG. 1A.

As shown, the conventional unit pixel includes one photodiode 110 and four NMOS transistors. Four NMOS transistors also include a transfer transistor 120, a reset transistor 130, an amplification transistor 140, and a switching transistor 150.

The photodiode 110 senses a light beam incident thereto and generates photoelectric charges.

The transfer transistor 120, coupled to a sensing node Ns, transfers the photoelectric charges to the sensing node Ns in response to a transfer control signal TX. The reset transistor 130, coupled to the sensing node Ns, makes a fully depleted region within the photodiode 110 and provides a reset voltage to the sensing node in response to a reset control signal RX.

The amplification transistor 140 amplifies a voltage level of the sensing node Ns to generate an amplified signal. The switching transistor 150, coupled to the amplification transistor 140 and an output terminal Nout, performs a switching operation to output the amplified signal as an image data via the output terminal Nout in response to a switching control signal SX.

Among four NMOS transistors, the transfer transistor 120 and the reset transistor 130 are implemented with a depletion-mode NMOS transistor or a negative NMOS transistor having low threshold voltage in order to improve a charge transfer efficiency and reduce a voltage loss or a voltage drop of the image data.

In such a conventional unit pixel, since a procedure of resetting the sensing node Ns is achieved by the transfer transistor 120 and the reset transistor 130, excess charges in a saturation region should be flowed from the transfer and the reset transistors 120 and 130 to a power line VDD. Therefore, it is very important to control a voltage barrier of the transfer transistor 120 and the reset transistor 130. If the voltage barrier in either the transfer transistor 120 or the reset transistor 130 is not controlled correctly, the excess charges may undesirably flow to neighboring unit pixels so that an erroneous operation is caused. This phenomenon is called a blooming effect. As a result, due to the blooming effect, it is difficult to obtain an exact image data, thereby reducing an optical sensitivity of a CMOS image sensor.

SUMMARY OF THE INVENTION

It is, therefore, an object of the present invention to provide a CMOS image sensor having a plurality of unit pixels for preventing a blooming effect.

In accordance with an aspect of the present invention, there is provided an image sensor having a plurality of unit pixels, each unit pixel comprising: a light sensing means for sensing a light beam incident thereto and generating photoelectric charges; a transferring means for transferring the photoelectric charges to a sensing node; a first resetting means for making a fully depleted region within the light sensing means and resetting the sensing node by providing a power supply voltage to the sensing node; and a second resetting means for transferring excess charges generated in the light sensing means to a power line when the sensing node is reset.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1A:
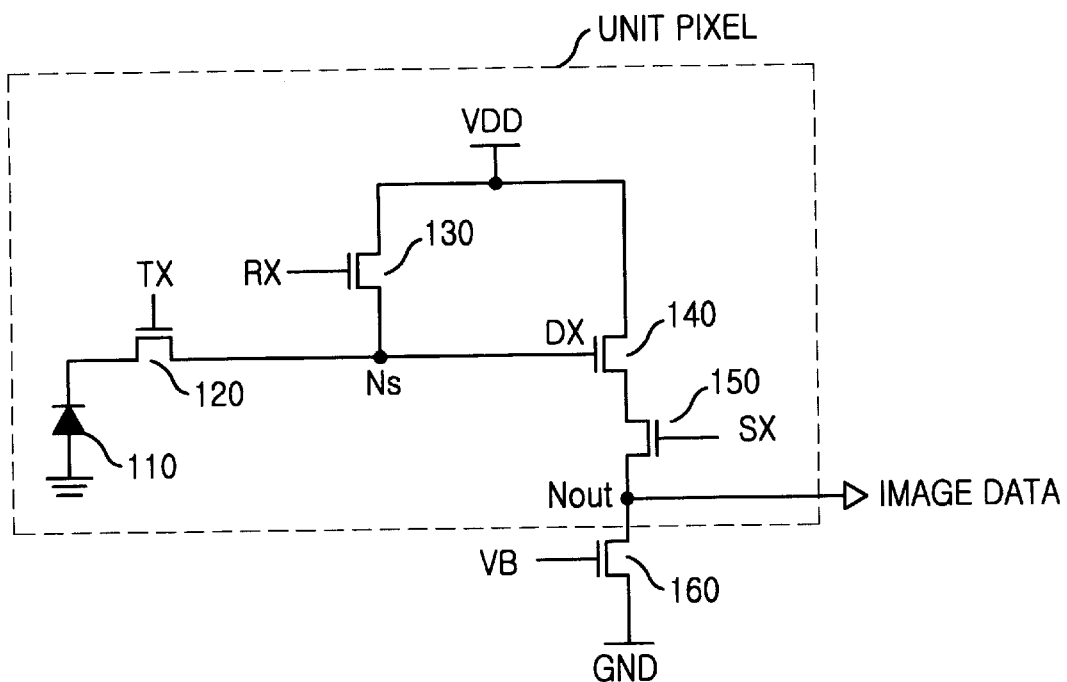
FIG. 1A is a circuit diagram showing a conventional unit pixel contained in a CMOS image sensor.
Figure 1B:
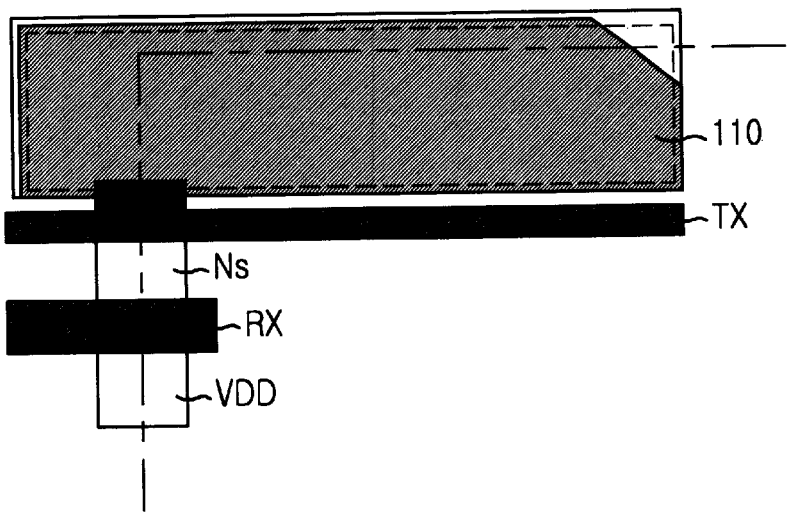
FIG. 1B is a diagram showing a layout of a conventional unit pixel shown in FIG. 1A.
Figure 2A:
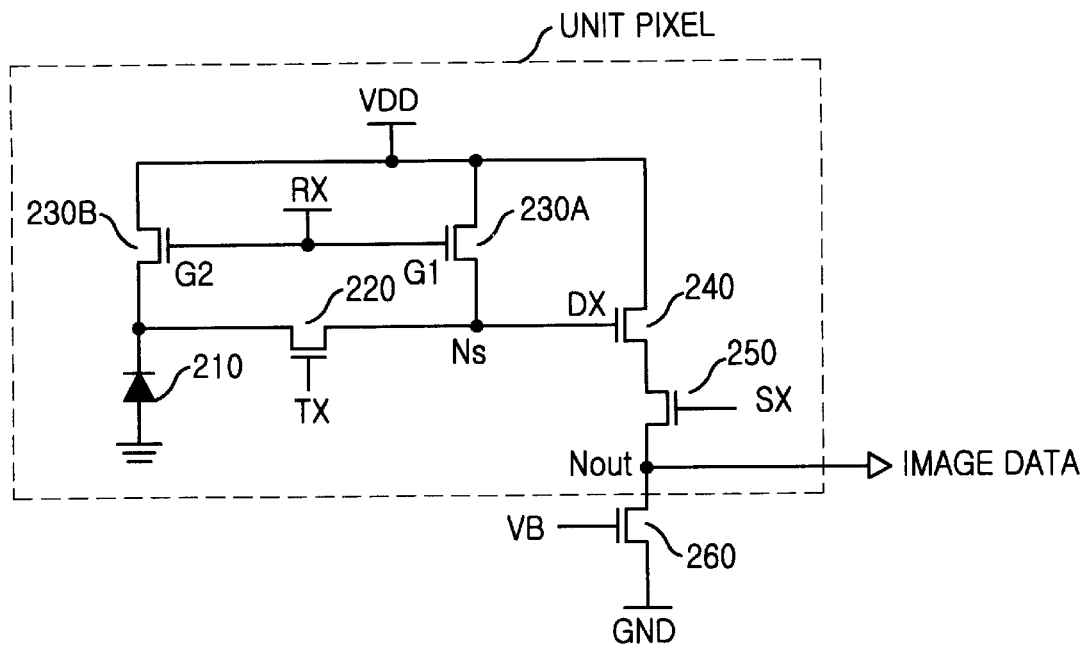
FIG. 2A is a circuit diagram illustrating a unit pixel contained in a CMOS image sensor in accordance with the present invention.
Figure 2B:
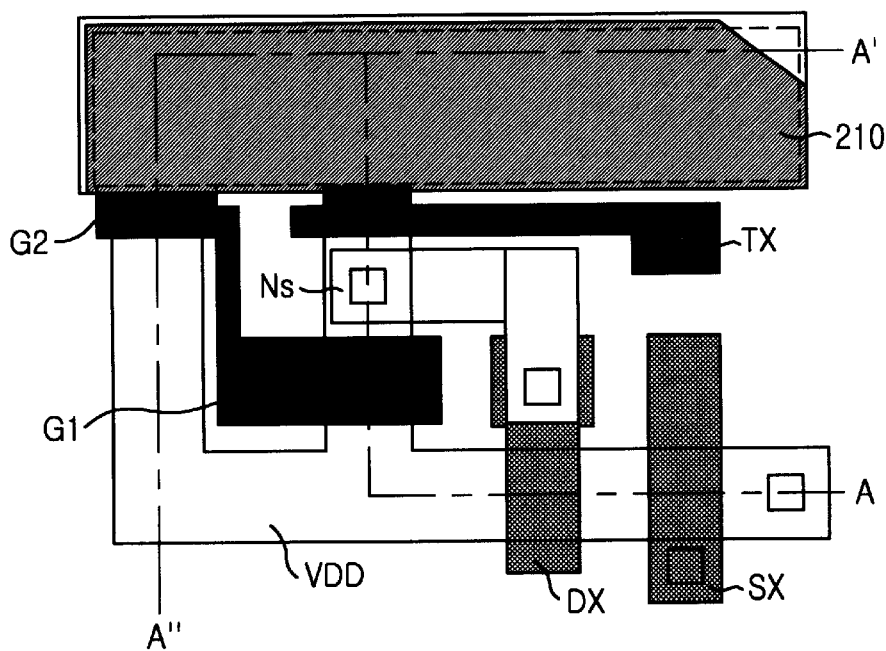
FIG. 2B is a diagram illustrating a layout of a unit pixel shown in FIG. 2A.

FIG. 2A is a circuit diagram illustrating a unit pixel contained in a CMOS image sensor in accordance with the present invention. A reference numeral 260 represents a load transistor used for stabilizing an output signal of the unit pixel. FIG. 2B is a diagram illustrating a layout of a unit pixel shown in FIG. 2A.

Referring to FIG. 2A, the unit pixel in accordance with the present invention includes one photodiode 210 as a light sensing element and five NMOS transistors as a control means. Five NMOS transistors also include a transfer transistor 220, a first reset transistor 230A, a second reset transistor 230B, an amplification transistor 240, and a switching transistor 250.

The photodiode 210 senses a light beam incident thereto and generates photoelectric charges.

The transfer transistor 220, coupled between the photodiode 210 and a sensing node Ns, transfers the photoelectric charges to the sensing node Ns in response to a transfer control signal TX.

The first reset transistor 230A, coupled between the sensing node Ns and a power line VDD, makes a fully depleted region within the photodiode 210 and performs a reset operation by providing a reset voltage to the sensing node Ns in response to a reset control signal RX.

The second reset transistor 230B, coupled between the photodiode 210 and the power line VDD, transfers excess charges generated in the photodiode 210 to the power line VDD in response to the reset control signal RX. At this time, the second reset transistor 230B has a threshold voltage lower than the first reset transistor 230A so that the excess charges are easily transferred to the power line VDD.

The amplification transistor 240 amplifies a voltage level of the sensing node Ns and generates an amplified signal. The switching transistor 250, coupled between the amplification transistor 240 and an output terminal Nout, performs a switching operation to output the amplified signal as an image data via the output terminal Nout in response to a switching control signal SX.

As shown in FIG. 2B, a gate G1 of the first reset transistor 230A and a gate G2 of the second reset transistor 230B are connected by one same conductive layer.

Figure 3A:
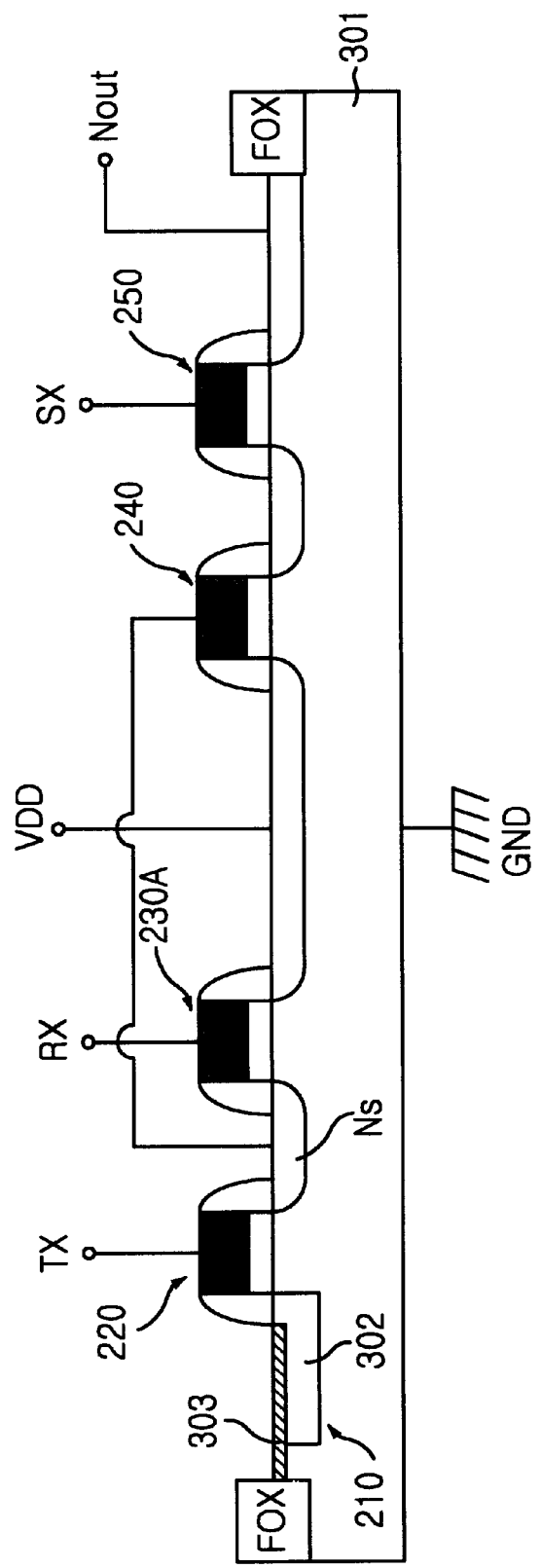
FIG. 3A is a cross-sectional view taken along the line A'–A in FIG. 3B.
Figure 3B:
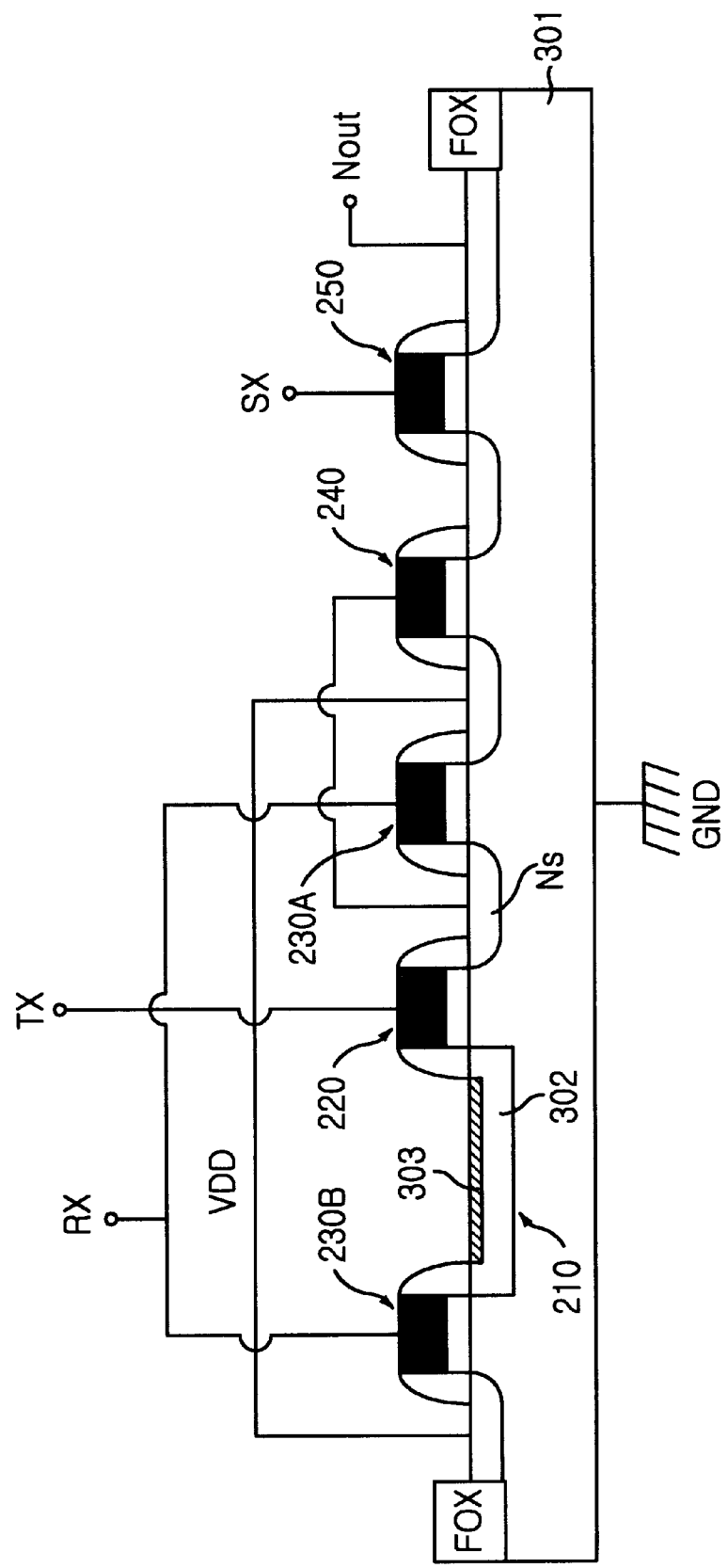
FIG. 3B is a cross-sectional view taken along the line A"–A in FIG. 3B.

FIGS. 3A and 3B are cross-sectional views taken along the lines A'–A and A"–A in FIG. 2B, respectively.

Referring to FIGS. 3A and 3B, the photodiode 210 in accordance with the present invention can be provided by sequentially forming an N-type doping region 302 and a P-type doping region 303 on a semiconductor substrate 301. Furthermore, like the transfer transistor 220, a channel region of the second reset transistor 230B is directly connected with the N-type doping region 302 of the photodiode 210.

Preferably, the semiconductor substrate 301 is provided by forming a P-type epitaxial layer on a P-type substrate, wherein an impurity concentration of the P-type epitaxial layer is lower than that of the P-type substrate. Additionally, by forming the P-type doping region 303 to be directly in contact with the semiconductor substrate 301, a fully depleted region can be made within the photodiode in a power supply voltage of 5 V or 3.3 V to 2.5 V.

Figure 4:
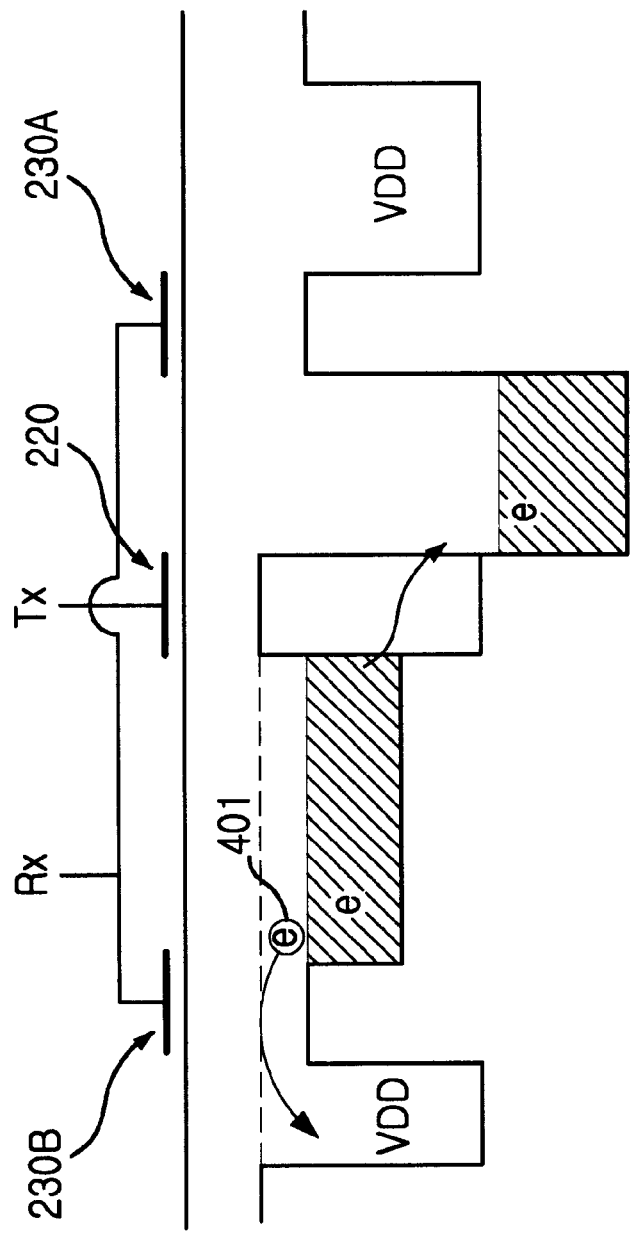
FIG. 4 is a diagram illustrating a potential of a unit pixel after a reset operation.

FIG. 4 is a diagram illustrating a potential of a unit pixel in accordance with the present invention after a reset operation.

As can be seen, since the threshold voltage of the second reset transistor 230B is lower than that of the first reset transistor 230A, the excess charges 401 can be easily transferred toward the power line VDD, thereby preventing the undesirable blooming effect and improving the optical sensitivity of the CMOS image sensor.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:
1. An image sensor having a plurality of unit pixels, each unit pixel comprising:
   a light sensing means for sensing a light beam incident thereto and generating photoelectric charges;
   a transferring means for transferring the photoelectric charges to a sensing node;
   a first resetting means for making a fully depleted region within the light sensing means and resetting the sensing node by providing a power supply voltage to the sensing node; and
   a second resetting means for transferring excess charges generated in the light sensing means to a power line when the sensing node is reset.

2. The image sensor as recited in claim 1, further comprising:
   an amplifying means for amplifying a voltage level of the sensing node to generate an amplified signal; and
   a switching means for performing a switching operation to transfer the amplified signal to an output terminal.

3. The image sensor as recited in claim 1, wherein the transferring means is coupled between the light sensing means and the sensing node.

4. The image sensor as recited in claim 3, wherein the first resetting means is coupled between the sensing node and the power line.

5. The image sensor as recited in claim 4, wherein the second resetting means is coupled between the light sensing means and the power line.

6. The image sensor as recited in claim 5, wherein the light sensing means is a photodiode.

7. The image sensor as recited in claim 6, wherein the transferring means is an NMOS transistor.

8. The image sensor as recited in claim 7, wherein the first resetting means and the second resetting means are NMOS transistors.

9. The image sensor as recited in claim 4, wherein a threshold voltage of the second resetting means is lower than that of the first resetting means.

10. The image sensor as recited in claim 9, wherein the photodiode includes:
    a semiconductor substrate of a first conductive type;
    a first doping region of a second conductive type, formed on the semiconductor substrate; and
    a second doping region of the first conductive type, formed on the first doping region.

11. The image sensor as recited in claim 10, wherein a channel region of the second doping region is in contact with the first doping region.

12. The image sensor as recited in claim 11, wherein the second doping region is in contact with the semiconductor substrate.

13. The image sensor as recited in claim 12, wherein the first conductive type is a P-type and the second conductive type is an N-type.

14. The image sensor as recited in claim 10, wherein the semiconductor substrate further includes an epitaxial layer formed on the semiconductor substrate, an impurity concentration of the epitaxial layer being lower than that of the semiconductor substrate.

* * * * *